United States Patent
Imamura et al.

(10) Patent No.: US 8,810,032 B2
(45) Date of Patent: Aug. 19, 2014

(54) SEMICONDUCTOR DEVICE AND METHOD FOR MANUFACTURING OF SAME

(71) Applicant: Kabushiki Kaisha Toshiba, Tokyo (JP)

(72) Inventors: Tomomi Imamura, Kanagawa (JP); Tetsuo Matsuda, Kanagawa (JP); Yoshinosuke Nishijo, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/794,309

(22) Filed: Mar. 11, 2013

(65) Prior Publication Data
US 2013/0187281 A1    Jul. 25, 2013

Related U.S. Application Data

(62) Division of application No. 13/234,099, filed on Sep. 15, 2011, now Pat. No. 8,415,247, which is a division of application No. 12/645,908, filed on Dec. 23, 2009, now Pat. No. 8,067,310.

(30) Foreign Application Priority Data

Dec. 26, 2008   (JP) .................................. 2008-334263
Apr. 27, 2009   (JP) .................................. 2009-107728

(51) Int. Cl.
*H01L 23/48*   (2006.01)
*H01L 23/52*   (2006.01)
*H01L 23/532*  (2006.01)
*H01L 21/768*  (2006.01)

(52) U.S. Cl.
CPC .............................. *H01L 23/53209* (2013.01); *H01L 21/76883* (2013.01)
USPC ........... 257/750; 257/751; 257/758; 257/760; 438/622; 438/624

(58) Field of Classification Search
CPC ................... H01L 21/76849; H01L 23/53238; H01L 24/06; H01L 23/481; H01L 23/19827; H01L 24/81; H01L 21/76843; H01L 23/5329; H01L 21/32051; H01L 21/76846; H01L 21/7685; H01L 23/522; H01L 23/5226; H01L 23/485; H01L 21/7683
USPC .................. 257/750–751, 758, 760, E23.142, 257/E21.584; 438/622, 624
See application file for complete search history.

(56) References Cited

U.S. PATENT DOCUMENTS 5,561,082 A   10/1996 Matsuo et al.
5,789,320 A    8/1998 Andricacos et al.
(Continued)

FOREIGN PATENT DOCUMENTS

JP    S63318139 A   12/1988
JP    02-253628     10/1990
(Continued)

OTHER PUBLICATIONS

Japanese Office Action dated Jul. 31, 2013, filed in Japanese counterpart Application No. 2009-107728, 6 pages (with translation).

(Continued)

*Primary Examiner* — Theresa T Doan
(74) *Attorney, Agent, or Firm* — Patterson & Sheridan, LLP

(57) ABSTRACT

A method for manufacturing a semiconductor device, includes: forming a first metal layer on a semiconductor substrate, the semiconductor substrate including a diffusion layer; forming an insulating layer having an opening on the first metal layer; forming a second metal layer on the first metal layer in the opening of the insulating layer; removing the insulating layer; covering an exposed surface of the second metal layer with a third metal layer, the third metal layer including a metal having an ionization tendency lower than that of the second metal layer; and forming an electrode interconnect including the first metal layer, the second metal layer, and the third metal layer by removing the first metal layer using the third metal layer as a mask.

4 Claims, 12 Drawing Sheets

(56) References Cited

U.S. PATENT DOCUMENTS

| | | | |
|---|---|---|---|
| 5,933,752 | A | 8/1999 | Yanagida |
| 5,968,711 | A | 10/1999 | Lee et al. |
| 6,376,374 | B1 | 4/2002 | Stevens |
| 6,541,372 | B2 | 4/2003 | Wege et al. |
| 6,847,117 | B2 | 1/2005 | Nakatani |
| 6,887,789 | B2 | 5/2005 | Stevens |
| 6,936,923 | B2 | 8/2005 | Lin et al. |
| 7,795,128 | B2 | 9/2010 | Nakatani |
| 8,067,310 | B2 | 11/2011 | Imamura et al. |
| 2002/0022355 | A1 | 2/2002 | Kim |
| 2002/0100980 | A1 | 8/2002 | Sugiyama et al. |
| 2003/0192859 | A1 | 10/2003 | Uematsu et al. |
| 2008/0169562 | A1* | 7/2008 | Ke et al. .................. 257/737 |
| 2008/0299789 | A1* | 12/2008 | Usui et al. ................. 439/65 |

FOREIGN PATENT DOCUMENTS

| | | |
|---|---|---|
| JP | H02281629 A | 11/1990 |
| JP | H07135209 A | 5/1995 |
| JP | 2000-150518 | 5/2000 |
| JP | 2000-340685 | 12/2000 |
| JP | 2003-023236 | 1/2003 |
| JP | 2007208181 A | 8/2007 |
| JP | 2008-258499 | 10/2008 |
| JP | 2009016474 A | 1/2009 |

OTHER PUBLICATIONS

Japanese Office Action dated Apr. 1, 2014, filed in Japanese counterpart Application No. 2009-107728, 7 pages (with translation).

* cited by examiner

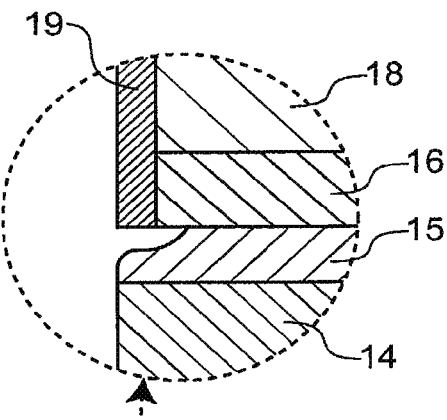
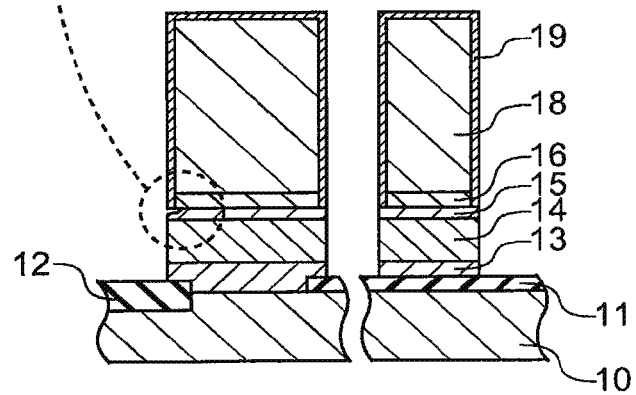
FIG. 4B
FIG. 4A

SEMICONDUCTOR DEVICE AND METHOD FOR MANUFACTURING OF SAME

CROSS-REFERENCE TO RELATED APPLICATIONS

This application is a divisional of co-pending U.S. application Ser. No. 13/234,099, filed on Sep. 15, 2011, and U.S. application Ser. No. 12/645,908, filed Dec. 23, 2009, issued as U.S. Pat. No. 8,067,310 on Nov. 19, 2011, which is based upon and claims the benefit of priority from the prior Japanese Patent Application No. 2008-334263, filed on Dec. 26, 2008 and the prior Japanese Patent Application No. 2009-107728, filed on Apr. 27, 2009; the entire contents of which are incorporated herein by reference.

BACKGROUND OF THE INVENTION

1. Field of the Invention

The invention relates to a semiconductor device including a thick film electrode and a method for manufacturing the same.

2. Background Art

Electrode films are being thickened to accompany the increased currents and the increased operation speeds of semiconductor devices. The electrode portions of such semiconductor devices are formed in stacked structures by sputtering. In the case where film thickening of the electrode portions is performed the electrode portions are formed using rerouting technology after chip formation (for example refer to JP-A 2003-23236 (Kokai)).

Therefore a rerouting process is necessary after completion of the manufacturing processes of the semiconductor chip which leads to an increase of the manufacturing processes. Moreover such rerouting technology makes openings by patterning an insulating film provided on the semiconductor, and continuous interconnects are formed in the openings. Because the insulating film is subsequently removed, unstable (easily reacting activation) metal is exposed at the 35 side wall portions of the rerouting portion, is susceptible to corrosion due to moisture and the like in air; and there is a risk of reduced reliability. Further, in the case where the foundation is patterned in this state, the unstable (easily reacting activation) metal of the side faces corrodes.

Therefore, it has also been proposed to form a thick film of copper (Cu) and form a covering film of gold (Au) by surface plating around the copper (Cu) (for example, refer to JP-A 2000-150518 (Kokai)).

SUMMARY OF THE INVENTION

According to an aspect of the invention, there is provided a method for manufacturing a semiconductor device, including: forming a first metal layer on a semiconductor substrate, the semiconductor substrate including a diffusion layer; forming an insulating layer having an opening on the first metal layer; forming a second metal layer on the first metal layer in the opening of the insulating layer; removing the insulating layer; covering an exposed surface of the second metal layer with a third metal layer, the third metal layer including a metal having an ionization tendency lower than that of the second metal layer; and forming an electrode interconnect including the first metal layer, the second metal layer, and the third metal layer by removing the first metal layer using the third metal layer as a mask.

According to another aspect of the invention, there is provided a method for manufacturing a semiconductor device, including: forming a first metal layer on a semiconductor substrate, the semiconductor substrate including a diffusion layer; forming an insulating layer having an opening on the first metal layer; forming a second metal layer on the first metal layer in the opening of the insulating layer; leaving the second metal layer and removing the insulating layer; removing the first metal layer using the second metal layer as a mask; covering an upper face and a side face of the second metal layer with a covering layer; forming a protective layer to protect the first metal layer and the second metal layer, the protective layer having an opening; removing the covering layer from the opening of the protective layer to make a space between the second metal layer and the protective layer; and forming an electrode interconnect including the first metal layer, the second metal layer, and the third metal layer by covering an exposed surface of the second metal layer of the space with a third metal layer, the third metal layer including a metal having an ionization tendency lower than that of the second metal layer.

According to still another aspect of the invention, there is provided a semiconductor device, including: a semiconductor substrate including a diffusion layer; a first metal layer formed on the semiconductor substrate; a second metal layer formed on the first metal layer; and a third metal layer covering the second metal layer, the first metal layer, the second metal layer, and the third metal layer being formed in substantially the same configuration by patterning.

BRIEF DESCRIPTION OF THE DRAWINGS

FIGS. 4A and 4B are schematic cross-sectional views illustrating a new problem of the method for manufacturing the semiconductor device according to the first embodiment of the invention;

DETAILED DESCRIPTION OF THE INVENTION

Figure 1A:
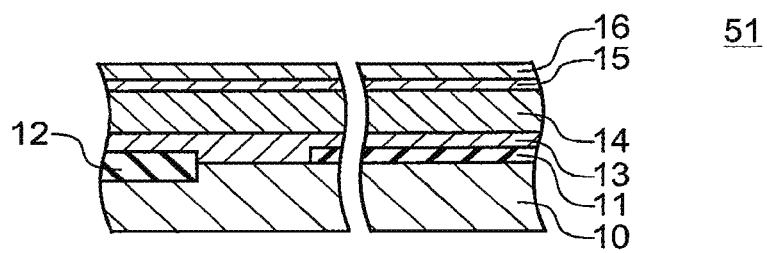
FIGS. 1A to 1D are cross-sectional views of processes, illustrating a method for manufacturing a semiconductor device according to a first embodiment of the invention.

Embodiments of the invention will now be described in detail with reference to the drawings.

The drawings are schematic or conceptual; and the relationships between the configuration and width of portions, the proportions of sizes among portions, etc., are not necessarily the same as the actual values thereof. Further, the dimensions and proportions may be illustrated differently among drawings, even for identical portions.

In the specification and drawings of the application, components similar to those described in regard to a drawing thereinabove are marked with same reference numerals, and a detailed description is omitted as appropriate.

First Embodiment: Manufacturing Method 51

FIGS. 1A to 2C are cross-sectional views of processes, illustrating a method for manufacturing a semiconductor device according to a first embodiment of the invention.

FIGS. 1A to 2C are schematic cross-sectional views of the semiconductor device during electrode formation processes of manufacturing processes of the semiconductor device.

The illustrated semiconductor device is a vertical MOSFET. Two insulating films 11 and 12 and a not-illustrated diffusion layer are formed on a semiconductor substrate 10. A drain electrode (not illustrated) is formed on a surface of the semiconductor substrate 10 on which a semiconductor element is formed on a side opposite to the two insulating films 11 and 12.

A manufacturing method 51 of a semiconductor device 61 of this example includes the following processes.

As illustrated in FIG. 1A, a first barrier layer 13 is formed on the semiconductor substrate 10 including the diffusion layer. For example, titanium (Ti), titanium-tungsten (TiW), or titanium nitride (TiN) is formed by sputtering with a film thickness of 300 to 500 nm. The first barrier layer 13 is formed on the semiconductor substrate 10 and on the insulating films 11 and 12 formed on the semiconductor substrate 10.

Here, the insulating films 11 and 12 are single-layer films or stacked films made of a silicon nitride film SiN or a silicon oxide film SiO by plasma CVD (hereinbelow referred to as "P—SiN" and "P—SiO") or a silicon oxide film $SiO_2$ formed in a prior process with, for example, a film thickness of 500 to 1,000 nm. In FIG. 1A, the insulating films 11 and 12 illustrate a gate insulating film and an element-isolation insulating film, respectively.

A first metal layer 14 is formed on the first barrier layer 13.

For example, aluminum (Al), Al—Si, Al—Si—Cu, or Al—Cu is formed with a film thickness of 1 to 2 µm. The first barrier layer 13 isolates the first metal layer 14 from the semiconductor substrate 10, prevents the first metal layer 14 from diffusing into the semiconductor substrate 10, and prevents reactions between the first metal layer 14 and the semiconductor substrate 10. The first barrier layer 13 may not be formed depending on the type of the first metal layer 14.

In this example illustrating the method for manufacturing the vertical MOSFET, the first metal layer 14 forms a portion of a source electrode and a portion of a gate electrode after formation by patterning. In other words, the first barrier layer 13 formed on the semiconductor substrate 10 without the interposed insulating film 11 and the first metal layer 14 formed thereupon form the lower layer of a source electrode after formation by patterning. The first barrier layer 13 formed on the insulating film 11 and the first metal layer 14 formed thereupon form the lower layer of a gate electrode after formation by patterning.

A second barrier layer 15 is formed on the first metal layer 14. For example, titanium (Ti), titanium-tungsten (TiW), titanium nitride (TiN), tungsten (W), tantalum (Ta), tantalum nitride (TaN), or ruthenium (Ru) is formed with a film thickness of 100 to 300 nm. A seed layer 16 made of, for example, copper (Cu) is formed on the second barrier layer 15 by sputtering.

The seed layer 16 is necessary during electroplating of a second metal layer 18 and therefore is unnecessary in the case where the second metal layer 18 can be formed by electroless plating and the like. The seed layer 16 is unnecessary even in the case where the second metal layer 18 is formed by electroplating if the first metal layer 14, the first barrier layer 13 and the second barrier layer 15, and the like can supply the current and voltage to the surface layer necessary for the electroplating and if the adhesion between the layer to be formed by plating and the foundation can be ensured.

The second barrier layer 15, the first metal layer 14, and the first barrier layer 13 are formed to isolate the subsequently-formed second metal layer 18 from the semiconductor substrate 10, prevent the second metal layer 18 from diffusing into the semiconductor substrate 10, and prevent reactions between the second metal layer 18 and the semiconductor substrate 10. In the case where the first metal layer 14 can prevent the second metal layer 18 from diffusing into the semiconductor substrate 10, the first barrier layer 13 and the second barrier layer 15 are unnecessary.

Figure 1B:
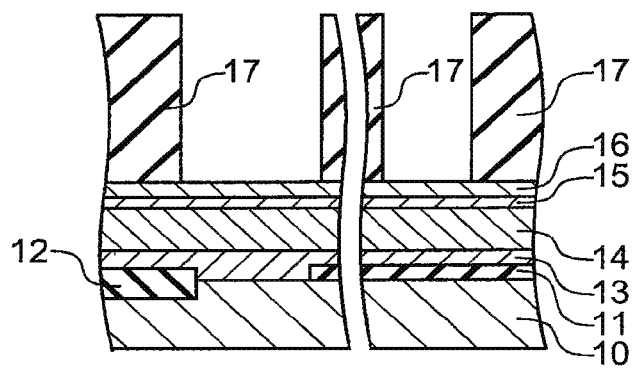

Then, as illustrated in FIG. 1B, an insulating layer 17 such as a resist is formed. An opening is made by patterning the insulating layer 17 by a lithography process and the like.

The opening of the insulating layer 17 made by patterning forms an electrode pattern.

Figure 1C:
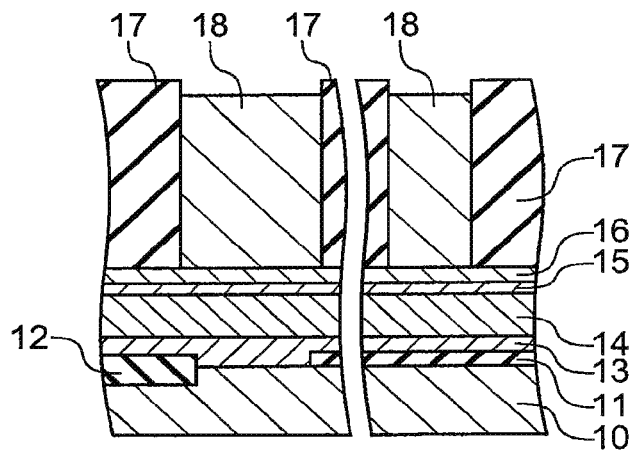

As illustrated in FIG. 1C, the second metal layer 18 is formed by plating.

For example, copper (Cu) is formed with a film thickness of 5 to 10 µm.

The plating may include electroplating using the seed layer 16 or the first metal layer 14 as a cathode. Or, electroless plating may be used.

Figure 1D:
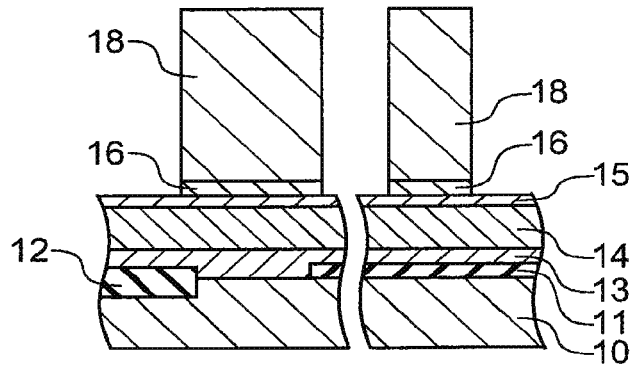

As illustrated in FIG. 1D, the insulating layer 17 is removed.

The insulating layer 17 and the seed layer 16 are removed by etching and the like until the second barrier layer 15 is exposed. The etching may be either wet etching or dry etching.

Figure 2A:
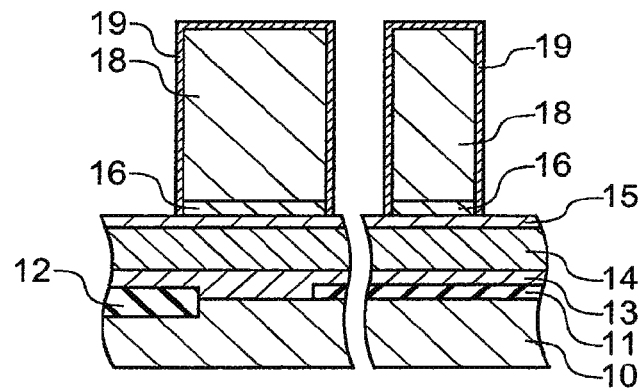
FIGS. 2A to 2C are cross-sectional views of processes, illustrating a method for manufacturing a semiconductor device according to the first embodiment of the invention.

Then, as illustrated in FIG. 2A, the exposed surfaces (the upper face and the side faces) of the second metal layer 18 and the seed layer 16 are coated (covered) with a third metal layer 19.

The coating (the covering) may be performed by electroless plating utilizing the potential difference between the metal forming the second metal layer 18 and the metal used for the second barrier layer 15.

The metal used for the third metal layer 19 is a metal having a low ionization tendency, that is, a metal more potentially noble (stable) than the metal (e.g., copper (Cu)) forming the second metal layer 18. For example, gold (Au), palladium (Pd), platinum (Pt), and the like may be formed with a film thickness of 0.05 µm. Also, nickel (Ni), Ni/Pd, or tin (Sn) may be formed first on the second metal layer 18 with a film thickness of 1 to 2 µm; and thereupon, a metal more potentially noble (stable) (having a lower ionization tendency) than the second metal layer 18 such as gold (Au), palladium (Pd), and platinum (Pt) may be formed with a film thickness of 0.05 μm.

Figure 2B:
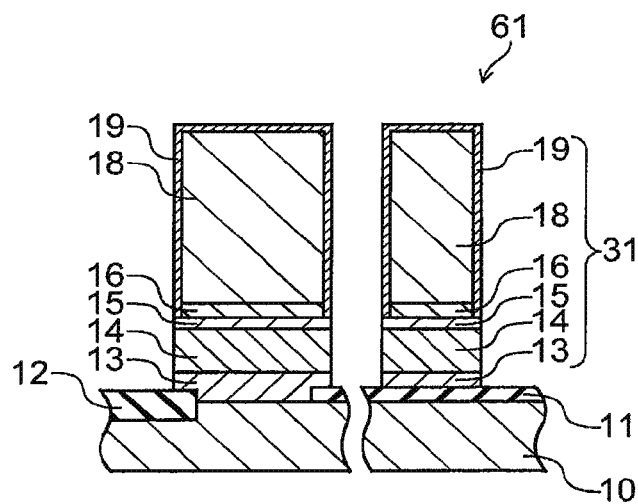

In this state, the third metal layer 19 coats (covers) the entire exposed surfaces, i.e., the upper face and the side faces, of the second metal layer 18 and may be used as a mask to pattern the first metal layer 14 of the foundation (FIG. 2B).

The second barrier layer 15, the first metal layer 14, and the first barrier layer 13 are removed by etching and the like until the insulating films 11 and 12 are exposed.

The etching may be either wet etching or dry etching.

Thereby, an electrode interconnect 31 including the first metal layer 14, the second metal layer 18, and the third metal layer 19 is formed with self-alignment in the desired interconnect pattern.

In this example illustrating the method for manufacturing the vertical MOSFET, the electrode interconnect 31 formed on the semiconductor substrate 10 without the interposed insulating film 11 forms a source pad portion. The electrode interconnect 31 formed on the insulating film 11 forms a gate pad portion and a gate draw out interconnect portion.

Figure 2C:
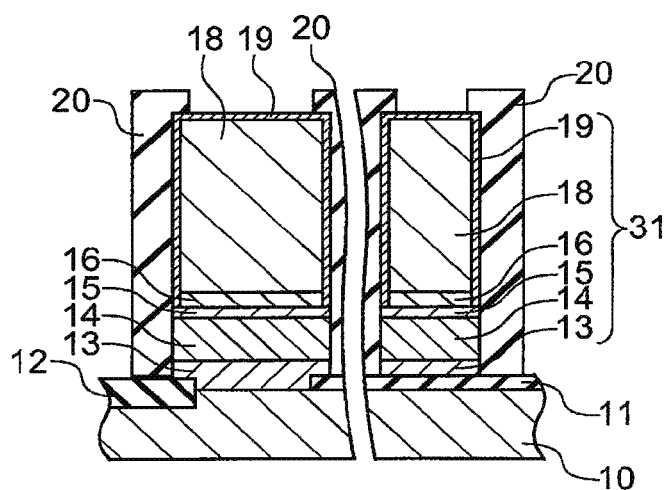

Further, as necessary, an insulating layer 20 (protective layer) may be filled into the trench made in prior processes (FIG. 2C).

The insulating layer 20 (the protective layer) is, for example, a single film or a stacked film of PI (polyimide), permanent resist, P—SiN, or P—SiO formed with a film thickness of 1 to 20 μm.

By the processes recited above, a semiconductor device 61 including the film-thickened electrode interconnect 31 is manufactured.

In this example, only the one patterning process of making the opening in the insulating layer 17 by patterning such as lithography and the like is necessary. Because the entire surfaces of the upper face and the side faces of the second metal layer 18 are coated (covered) with the third metal layer 19 including a potentially stable metal (having a low ionization tendency) during the etching of the first metal layer 14, diffusion and corrosion of the metal used for the second metal layer 18 are suppressed.

Although the case is described in this example where the electrode film of a MOSFET is thickened, the invention is not limited thereto and may be used in the manufacturing of a semiconductor device that includes a film-thickened electrode.

COMPARATIVE EXAMPLE

Manufacturing Method

A manufacturing method of a comparative example will now be described.

The manufacturing method of the comparative example is a manufacturing method that thickens an electrode film after completion of the element formation.

An electrode unit is formed by patterning on a semiconductor substrate on which the element is formed; and the entirety is covered with a protective film. Then, an opening is made in the protective film, and the element formation ends.

From this state, the film thickening of the electrode unit is performed.

First, a barrier layer and a copper (Cu) seed layer are formed on the entire surface of the chip.

An insulating film such as a resist is formed; and the insulating film is patterned to make an opening for connection to the electrode unit.

Then, a thick film made of copper (Cu) is formed in the opening. A protective film is formed on the thick film, and then the insulating film such as the resist is removed. Finally, the seed layer and the barrier layer are removed.

The film of the electrode is thickened by the processes recited above.

Thus, the manufacturing method that thickens the electrode film of the comparative example requires the two patterning processes of the insulating film for the electrode unit formation prior to completion of the device formation and for the thick film electrode formation performed after the device formation, which may lead to an increase of manufacturing processes.

Unstable (easily reacting activation) metal of the side wall portion of the thick film, i.e., the rerouting portion, is exposed after the resist removal; corrosion by moisture and the like in air occurs easily; and there is a risk of poor reliability. In the case where the foundation is patterned in this state, the unstable (easily reacting activation) metal of the side face corrodes.

Moreover, the contact surface area of the electrode unit between the thick film and the layer therebelow decreases, and the electrical resistance increases.

Conversely, in the manufacturing method 51 of the invention recited above, the patterning is performed with a photoresist and/or photosensitive polyimide and the like directly on the first metal layer 14 formed on the entire surface partway through the semiconductor chip formation. After the second metal layer 18 is selectively formed by electroplating or electroless plating, the insulating layer 17 is removed; and the third metal layer 19 including a potentially noble (stable) metal (having a low ionization tendency) coats (covers) the entire exposed surfaces, i.e., the upper face and the side faces, of the second metal layer 18 by electroless plating.

Also, the third metal layer 19 coats (covers) the entire surface of the upper face and side faces of the second metal layer 18 and is used as a mask to form the electrode interconnect 31 with self-alignment.

Thereby, the number of patterning processes can be reduced to the one process of patterning the second metal layer 18.

Further, the second metal layer 18 is covered with the third metal layer 19 including a potentially noble (stable) metal (having a low ionization tendency); and thereby, diffusion and corrosion can be prevented.

The electrode interconnect 31 is formed with self-alignment using the third metal layer 19 which coats (covers) the entire exposed surfaces, i.e., the upper face and the side faces, of the second metal layer 18 as a mask. Accordingly, the cross-sectional area of any surface of the electrode interconnect 31 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

However, in the process illustrated in FIG. 2A, the third metal layer 19 coats (covers) the entire exposed surfaces of the second metal layer 18 and the seed layer 16. At this time, electroless plating is performed utilizing the potential difference between the metal (e.g., copper (Cu)) forming the second metal layer 18 and the metal used for the second barrier layer 15.

However, the third metal layer 19 may coat (cover) not only the entire exposed surfaces of the second metal layer 18 and the seed layer 16 but also may coat (cover) the second barrier layer 15.

Another embodiment to solve this problem will now be described.

Second Embodiment: Manufacturing Method 52

FIGS. 3A to 3D are cross-sectional views of processes, illustrating a method for manufacturing a semiconductor device according to a second embodiment of the invention.

A manufacturing method 52 of a semiconductor device 62 of this example includes the following processes.

FIGS. 3A to 3D are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

The processes of the manufacturing method 52 of this example are similar to the processes of the manufacturing method 51 recited above up to the removing of the insulating layer 17 illustrated in FIG. 1D; and therefore, a description is omitted.

The subsequent processes will now be described.

Figure 3A:
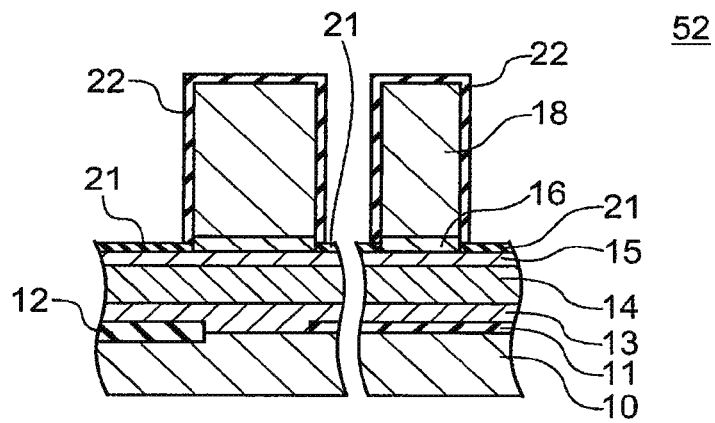
FIGS. 3A to 3D are cross-sectional views of processes, illustrating a method for manufacturing a semiconductor device according to a second embodiment of the invention.

As illustrated in FIG. 3A, an oxide film 21 is formed on the surface of the second barrier layer 15, and an oxide film 22 is formed on the surfaces of the seed layer 16 and the second metal layer 18.

The oxide films 21 and 22 are formed by, for example, heat treatment in an atmosphere of a single gas or a gas mixture of two or more types selected from oxygen ($O_2$), water vapor ($H_2O$), nitrous oxide ($N_2O$), nitric oxide (NO), nitrogen dioxide ($NO_2$), carbon monoxide (CO), and carbon dioxide ($CO_2$); or the single gas or the gas mixture mixed with at least one type of gas selected from argon (Ar), nitrogen ($N_2$), and hydrogen ($H_2$). In the case where a native oxide film is formed, it is unnecessary to implement heat treatment.

Figure 3B:
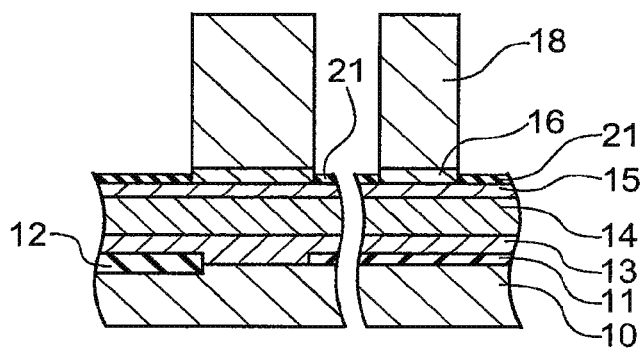

Then, as illustrated in FIG. 3B, only the oxide film 22 on the seed layer 16 and the second metal layer 18 is removed.

Figure 3C:
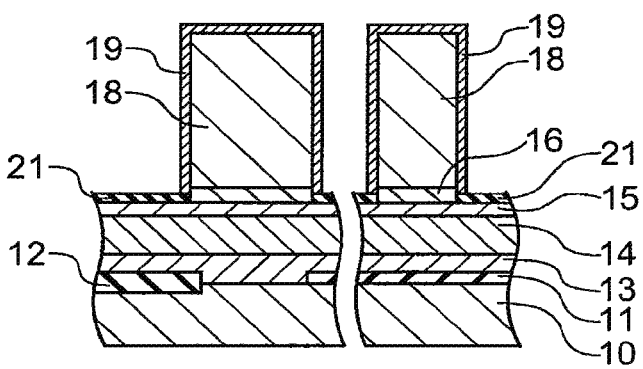

Subsequently, as illustrated in FIG. 3C, the entire exposed surfaces (the upper face and the side faces) of the second metal layer 18 and the seed layer 16 are coated (covered) with the third metal layer 19 by electroplating or electroless plating.

Then, the second barrier layer 15 has the oxide film 21 formed on the surface, and is insulated from a region above the oxide film 21. Thereby, it is possible to transfer electrons only through the exposed surfaces (the upper face and the side faces) of the seed layer 16 and the second metal layer 18 which are not provided with insulating films on the surfaces; and it is possible to coat (cover) the entire exposed surfaces selectively with the third metal layer 19.

The third metal layer 19 is similar to that of the manufacturing method 51 recited above; and therefore, a description is omitted.

Figure 3D:
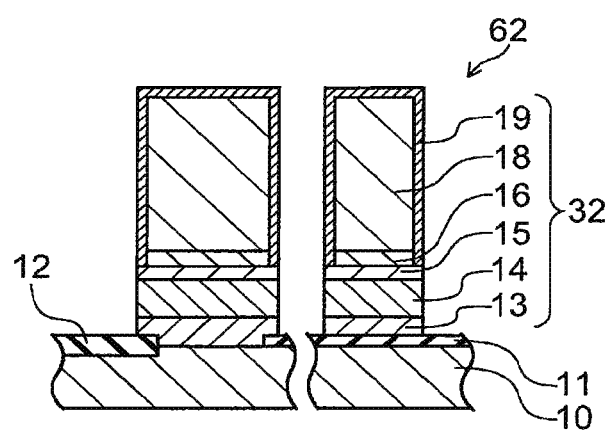

In this state, it is possible to pattern the first metal layer 14 of the foundation using the third metal layer 19, which coats (covers) the entire exposed surfaces, i.e., the upper face and the side faces, of the second metal layer 18, as a mask (FIG. 3D).

The second barrier layer 15, the first metal layer 14, and the first barrier layer 13 are removed by etching and the like until the insulating films 11 and 12 are exposed.

The etching may be either wet etching or dry etching.

Thereby, an electrode interconnect 32 including the first metal layer 14, the second metal layer 18, and the third metal layer 19 is formed with self-alignment in the desired interconnect pattern.

In this example illustrating the method for manufacturing the vertical MOSFET, the electrode interconnect 32 formed on the semiconductor substrate 10 without the interposed insulating film 11 forms a source pad portion. The electrode interconnect 32 formed on the insulating film 11 forms a gate pad portion and a gate draw out interconnect portion.

Further, as necessary, the insulating layer 20 (the protective layer) may be filled into the trench made in prior processes (not illustrated).

The insulating layer 20 (the protective layer) is, for example, a single film or a stacked film of PI, permanent resist, P—SiN, or P—SiO formed with a film thickness of 1 to 20 μm.

By the processes recited above, a semiconductor device 62 including the film-thickened electrode interconnect 32 is manufactured.

Although the processes of the manufacturing method 52 are more complex than those of the manufacturing method 51, the entire exposed surfaces of only the second metal layer 18 and the seed layer 16 are coated (covered) with the third metal layer 19. Therefore, the entire surface of the second metal layer 18 is coated (covered) with the third metal layer 19 including a potentially stable metal (having a low ionization tendency) during the etching of the first metal layer 14; and therefore, diffusion and corrosion of the metal used for the second metal layer 18 are suppressed.

The electrode interconnect 32 is formed with self-alignment using the third metal layer 19, which coats (covers) the entire exposed surfaces, i.e., the upper face and the side faces, of the second metal layer 18 as a mask. Accordingly, the cross-sectional area of any surface of the electrode interconnect 32 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

Although the case is described in this example where the electrode film of a vertical MOSFET is thickened, the invention is not limited thereto and may be used in the manufacturing of a semiconductor device that includes a film-thickened electrode, similarly to the manufacturing method 51.

However, returning once again to FIGS. 1A to 2C, in the case where the second barrier layer 15, the first metal layer 14, and the first barrier layer 13 are etched in the state illustrated in FIG. 2B, the second barrier layer 15 may be eroded, and the metal (e.g., copper (Cu)) forming the seed layer 16 or the second metal layer 18 may be exposed.

As illustrated in FIG. 4A, the second barrier layer 15 is eroded proximally to the point of contact of the second barrier layer 15, the seed layer 16, and the third metal layer 19 (the portion enclosed by the broken line); and the bottom face of the seed layer 16 may be exposed.

FIG. 4B is an enlarged view of the portion enclosed by the broken line in FIG. 4A.

In particular, corrosion may occur from this portion caused by over-etching by wet etching until the insulating films 11 and 12 are exposed.

Another embodiment to solve this problem will now be described.

Third Embodiment: Manufacturing Method 53

Figure 5A:
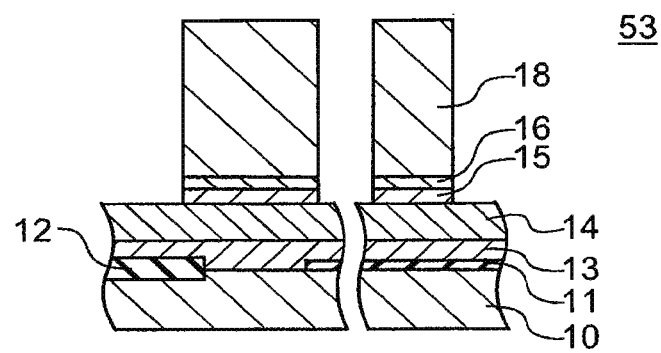
FIGS. 5A to 5C are cross-sectional views of processes, illustrating a method for manufacturing a semiconductor device according to a third embodiment of the invention.
Figure 5B:
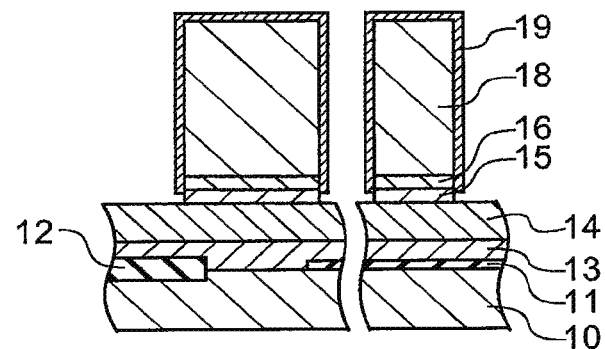
Figure 5C:
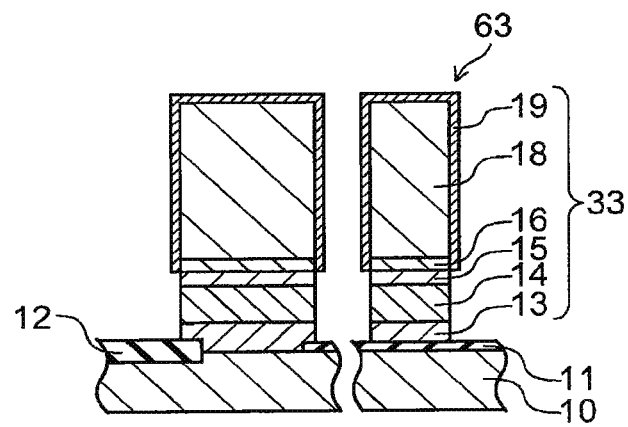

FIGS. 5A to 5C are cross-sectional views of processes, illustrating a method for manufacturing a semiconductor device according to a third embodiment of the invention.

A manufacturing method 53 of a semiconductor device 63 of this example includes the following processes.

FIGS. 5A to 5C are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

The processes of the manufacturing method 53 of this example are similar to the processes of the manufacturing method 51 recited above up to the forming of the second metal layer 18 (e.g., copper (Cu)) by plating illustrated in FIG. 1C; and therefore, a description is omitted.

The subsequent processes will now be described.

As illustrated in FIG. 5A, the manufacturing method 53 differs from the manufacturing method 52 illustrated in FIGS. 3A to 3D in that the seed layer 16 and the second barrier layer 15 also are removed during the removing of the insulating layer 17.

After removing the insulating layer 17, the seed layer 16 and the second barrier layer 15 are removed with self-alignment by etching and the like using the second metal layer 18 as a mask until the first metal layer 14 is exposed. The etching may be either wet etching or dry etching.

As illustrated in FIG. 5B, the entire exposed surfaces of the seed layer 16 and the second metal layer 18 are coated (covered) with the third metal layer 19.

Thus, after etching the second barrier layer 15, the over-etching portion of the second barrier layer 15 also may be plated by selective plating with the third metal layer by electroless plating.

It is possible to completely cover not only the upper face and the side faces of the second metal layer 18 and the seed layer 16 but also the bottom face of the seed layer 16 exposed by over-etching of the second barrier layer 15; and fluctuation of reliability can be eradicated.

The third metal layer 19 is similar to that of the manufacturing method 51 recited above; and therefore, a description is omitted.

In this state, it is possible to pattern the first metal layer 14 of the foundation using the third metal layer 19, which coats (covers) the entire exposed surfaces of the second metal layer 18, as a mask (FIG. 5C).

The first metal layer 14 and the first barrier layer 13 are removed by etching and the like until the insulating films 11 and 12 are exposed.

The etching may be either wet etching or dry etching.

Thereby, an electrode interconnect 33 including the first metal layer 14, the second metal layer 18, and the third metal layer 19 is formed with self-alignment in the desired interconnect pattern.

In this example illustrating the method for manufacturing the vertical MOSFET, the electrode interconnect 33 formed on the semiconductor substrate 10 without the interposed insulating film 11 forms a source pad portion. The electrode interconnect 33 formed on the insulating film 11 forms a gate pad portion and a gate draw out interconnect portion.

Further, as necessary, the insulating layer 20 (the protective layer) may be filled into the trench made in prior processes (not illustrated).

The insulating layer 20 (the protective layer) is, for example, a single film or a stacked film of PI, permanent resist, P—SiN, or P—SiO formed with a film thickness of 1 to 20 μm.

By the processes recited above, a semiconductor device 63 including the film-thickened electrode interconnect 33 is manufactured.

Similarly to the manufacturing method 51, only the one patterning process of patterning the insulating layer 17 to make the opening is necessary in the manufacturing method 53. The entire surface of the second metal layer 18 is coated (covered) with the third metal layer 19 including a potentially stable metal (having a low ionization tendency) during the etching of the first metal layer 14; and therefore, diffusion and corrosion of the metal used for the second metal layer 18 are suppressed.

Further, there is no risk of reliability fluctuation due to the second barrier layer 15 being eroded to expose the seed layer 16.

The electrode interconnect 33 is formed with self-alignment using the third metal layer 19, which coats (covers) the entire exposed surfaces of the second metal layer 18, as a mask. Accordingly, the cross-sectional area of any surface of the electrode interconnect 33 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

Although the case is described in this example where the electrode film of a MOSFET is thickened, the invention is not limited thereto and may be used in the manufacturing of a semiconductor device that includes a film-thickened electrode.

Another embodiment capable of solving the risk recited above that the second barrier layer 15 may be eroded to expose the seed layer 16 will now be described.

Fourth Embodiment: Manufacturing Method 54

FIGS. 6A to 6D are cross-sectional views of processes, illustrating a method for manufacturing a semiconductor device according to a fourth embodiment of the invention.

A manufacturing method 54 of a semiconductor device 64 of this example includes the following processes.

FIGS. 6A to 6D are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

The processes of the manufacturing method 54 of this example are similar to the processes of the manufacturing method 51 recited above up to the forming of the second metal layer 18 (e.g., copper (Cu)) by plating illustrated in FIG. 1C; and therefore, a description is omitted.

The subsequent processes will now be described.

Figure 6A:
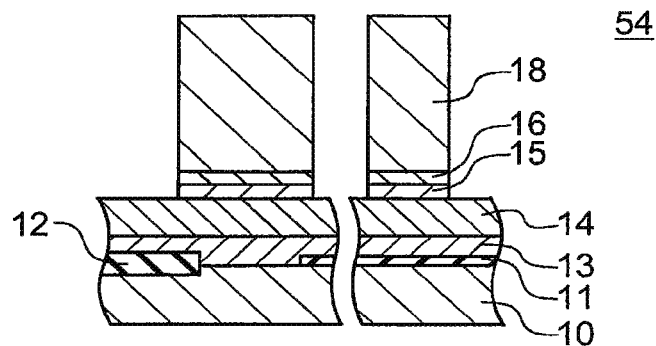
FIGS. 6A to 6D are cross-sectional views of processes, illustrating a method for manufacturing a semiconductor device according to a fourth embodiment of the invention.

As illustrated in FIG. 6A, the seed layer 16 and the second barrier layer 15 also are removed during the removing of the insulating layer 17.

The insulating layer 17, the seed layer 16, and the second barrier layer 15 are removed by etching and the like until the first metal layer 14 is exposed.

The etching may be either wet etching or dry etching.

Figure 6B:
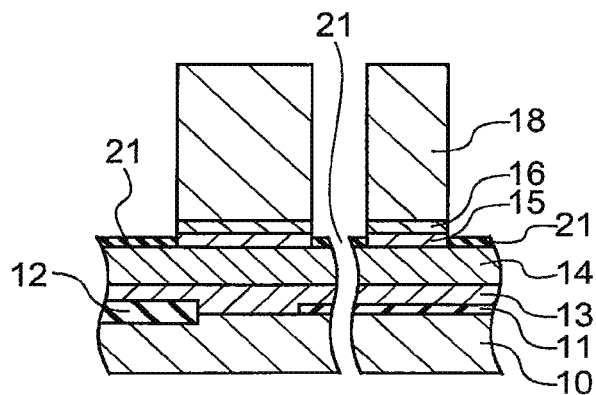

Then, as illustrated in FIG. 6B, the oxide film 21 is formed on the surface of the first metal layer 14.

The oxide film 21 is formed by, for example, heat treatment in an atmosphere of a single gas or a gas mixture of two or more types selected from oxygen ($O_2$), water vapor ($H_2O$), nitrous oxide ($N_2O$), nitric oxide (NO), nitrogen dioxide ($NO_2$), carbon monoxide (CO), and carbon dioxide ($CO_2$); or the single gas or the gas mixture mixed with at least one type of gas selected from argon (Ar), nitrogen ($N_2$), and hydrogen ($H_2$). At this time, the partial pressure and the temperature are adjusted such that the first metal layer 14 is oxidized and the second metal layer 18 does not proceed to be oxidized. In the case where a native oxide film is formed without performing a special heat treatment such as the case where the first metal layer 14 is aluminum (Al), the heat treatment is unnecessary, and the manufacturing processes can be simplified.

Figure 6C:
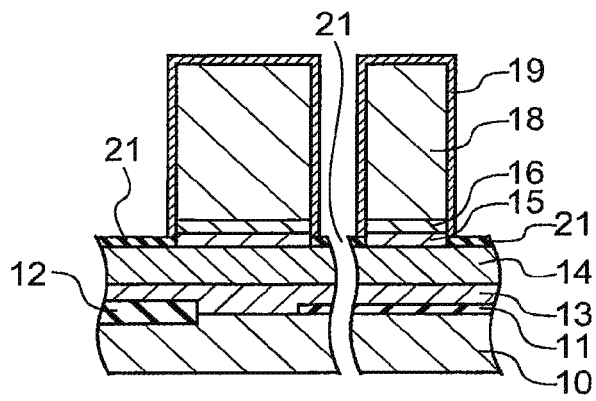

Then, the only oxide film on the second barrier layer 15, the seed layer 16 and the second metal layer 18 is removed, and as illustrated in FIG. 6C, the entire exposed surfaces of the second barrier layer 15, the seed layer 16 and the second metal layer 18 are coated (covered) with the third metal layer 19 by electroplating or electroless plating.

Then, the first metal layer 14 has the oxide film 21 formed on the surface, and is insulated from a region above the oxide film 21. Thereby, it is possible to transfer electrons only through the exposed surfaces (the upper face and the side faces) of the seed layer 16 and the second metal layer 18 which are not provided with insulating films on the surfaces; and it is possible to coat (cover) the entire exposed surfaces selectively with the third metal layer 19.

The third metal layer 19 is similar to that of the manufacturing method 51 recited above; and therefore, a description is omitted.

Figure 6D:
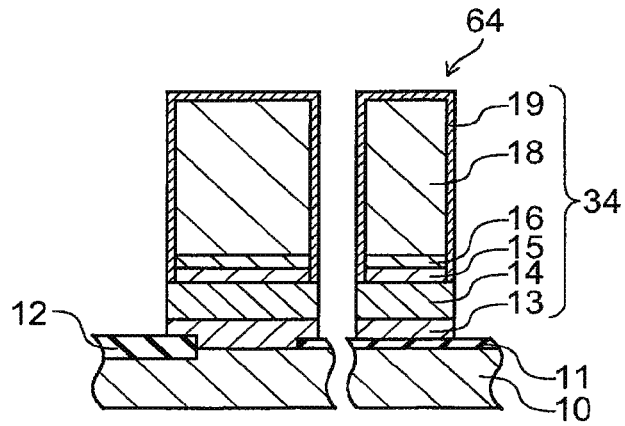

In this state, it is possible to pattern the first metal layer 14 of the foundation using the third metal layer 19, which coats (covers) the entire exposed surfaces of the second metal layer 18, as a mask (FIG. 6D).

The oxide film 21, the first metal layer 14, and the first barrier layer 13 are removed by etching and the like until the insulating films 11 and 12 are exposed.

The etching may be either wet etching or dry etching.

Thereby, an electrode interconnect 34 including the first metal layer 14, the second metal layer 18, and the third metal layer 19 is formed with self-alignment in the desired interconnect pattern.

In this example illustrating the method for manufacturing the vertical MOSFET, the electrode interconnect 34 formed on the semiconductor substrate 10 without the interposed insulating film 11 forms a source pad portion. The electrode interconnect 34 formed on the insulating film 11 forms a gate pad portion and a gate draw out interconnect portion.

Further, as necessary, the insulating layer 20 (the protective layer) may be filled into the trench made in prior processes (not illustrated).

The insulating layer 20 (the protective layer) is, for example, a single film or a stacked film of PI, permanent resist, P—SiN, or P—SiO formed with a film thickness of 1 to 20 μm.

By the processes recited above, a semiconductor device 64 including the film-thickened electrode interconnect 34 is manufactured.

Similarly to the manufacturing method 51, only the one patterning process of patterning the insulating layer 17 to make the opening is necessary in the manufacturing method 54. The entire surface of the second metal layer 18 is coated (covered) with the third metal layer 19 including a potentially stable metal (having a low ionization tendency) during the etching of the first metal layer 14; and therefore, diffusion and corrosion of the metal used for the second metal layer 18 are suppressed.

Further, there are no risks such as those recited above of the third metal layer 19 also coating (covering) the second barrier layer 15 or of the second barrier layer 15 being eroded to expose the seed layer 16.

The electrode interconnect 34 is formed with self-alignment using the third metal layer 19, which coats (covers) the entire exposed surfaces of the second metal layer 18, as a mask. Accordingly, the cross-sectional area of any surface of the electrode interconnect 34 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

Although the case is described in this example where the electrode film of a MOSFET is thickened, the invention is not limited thereto and may be used in the manufacturing of a semiconductor device that includes a film-thickened electrode.

Fifth Embodiment: Manufacturing Method 55

FIGS. 7A to 8D are cross-sectional views of processes, illustrating a method for manufacturing a semiconductor device according to a fifth embodiment of the invention.

A manufacturing method 55 of a semiconductor device 65 of this example includes the following processes.

FIGS. 7A to 8D are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

Figure 7A:
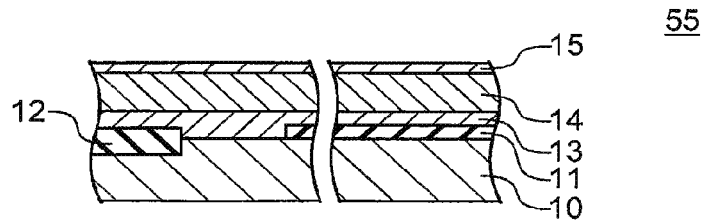
FIGS. 7A to 7D are cross-sectional views of processes, illustrating a method for manufacturing a semiconductor device according to a fifth embodiment of the invention.

As illustrated in FIG. 7A, the first barrier layer 13, the first metal layer 14, and the second barrier layer 15 are formed in order on the semiconductor substrate 10 including a diffusion layer.

This formation is similar to that of the manufacturing method 51; and therefore, a description is omitted. Thereinafter, the manufacturing method 51 is different in that the seed layer 16 is not formed.

Figure 7B:
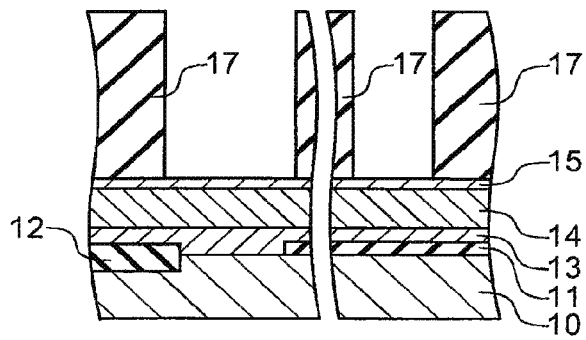

Then, as illustrated in FIG. 7B, the insulating layer 17 such as a resist is formed. The insulating layer 17 is patterned to make an opening.

The opening of the insulating layer 17 formed by patterning forms an electrode pattern.

Figure 7C:
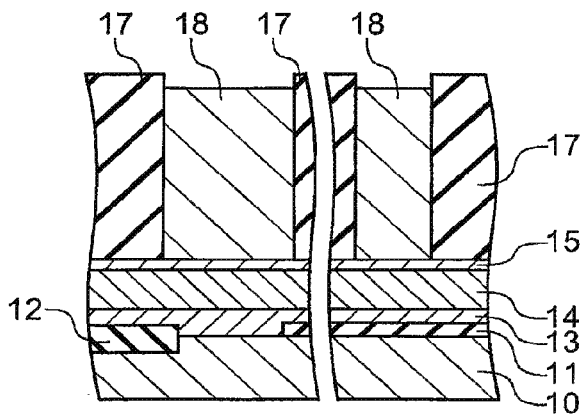

As illustrated in FIG. 7C, the second metal layer 18 is formed by electroless plating.

For example, copper (Cu) is formed with a film thickness of 5 to 10 μm.

In this example, the seed layer 16 is not formed. The seed layer 16 is unnecessary even in the case where the second metal layer 18 is formed by electroplating if the first metal layer 14, the first barrier layer 13 and the second barrier layer 15, and the like can supply the current and voltage to the surface layer necessary for the electroplating and if the adhesion between the plating film and the foundation can be ensured.

Figure 7D:
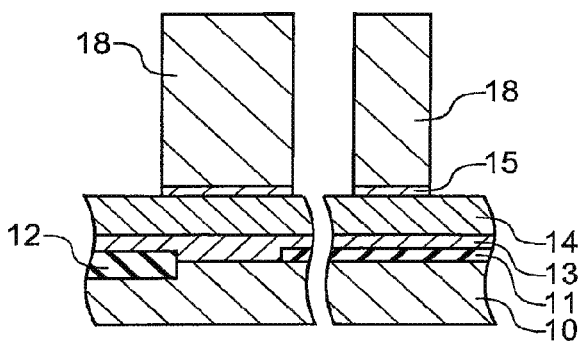

As illustrated in FIG. 7D, the insulating layer 17 is removed.

The insulating layer 17 and the second barrier layer 15 are removed by etching and the like until the first metal layer 14 is exposed.

Figure 8A:
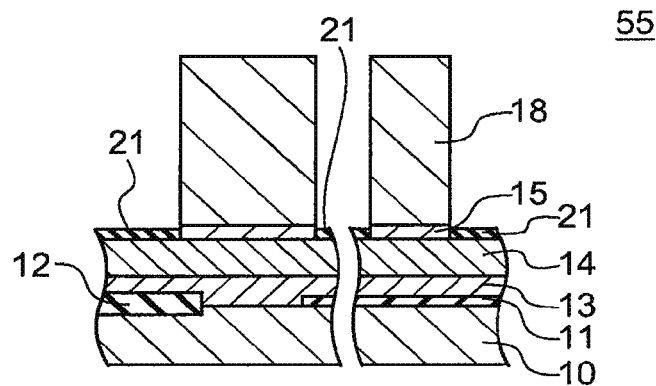
FIGS. 8A to 8D are cross-sectional views of processes, illustrating a method for manufacturing a semiconductor device according to the fifth embodiment of the invention.

Then, as illustrated in FIG. 8A, the oxide film 21 is formed on the surface of the first metal layer 14.

Because the subsequent processes are similar to those of the manufacturing method 53, a summary will now be described.

Figure 8B:
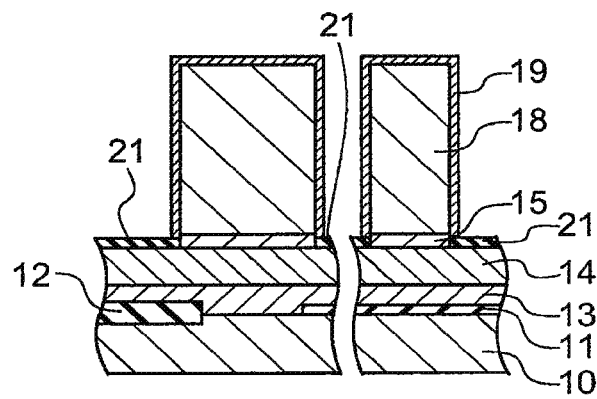

As illustrated in FIG. 8B, the entire exposed surfaces of the second metal layer 18 are coated (covered) with the third metal layer 19.

Figure 8C:
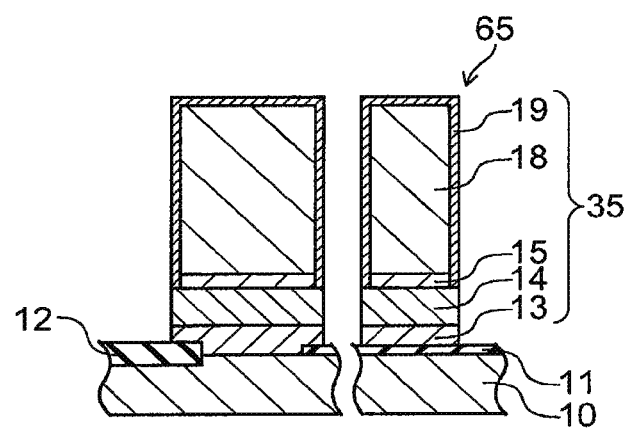

In this state, it is possible to pattern the first metal layer 14 of the foundation using the third metal layer 19, which coats (covers) the entire exposed surfaces of the second metal layer 18, as a mask (FIG. 8C).

The oxide film 21, the first metal layer 14, and the first barrier layer 13 are removed by etching and the like until the insulating films 11 and 12 are exposed.

The etching may be either wet etching or dry etching.

Thereby, an electrode interconnect 35 including the first metal layer 14, the second metal layer 18, and the third metal layer 19 is formed with self-alignment in the desired interconnect pattern.

In this example illustrating the method for manufacturing the vertical MOSFET, the electrode interconnect 35 formed on the semiconductor substrate 10 without the interposed insulating film 11 forms a source pad portion. The electrode interconnect 35 formed on the insulating film 11 forms a gate pad portion and a gate draw out interconnect portion.

Figure 8D:
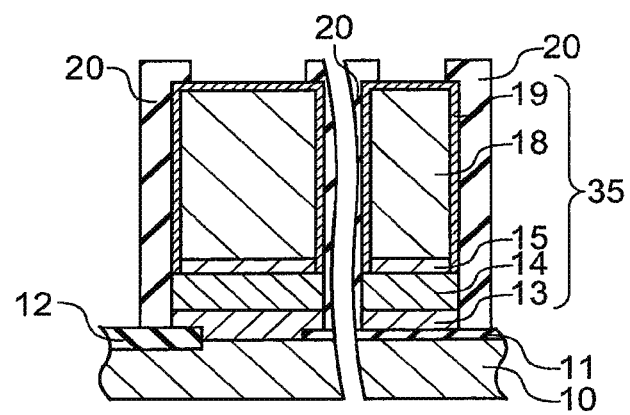

Further, as necessary, the insulating layer 20 (the protective layer) may be filled into the trench made in prior processes (FIG. 8D).

The insulating layer 20 (the protective layer) is, for example, a single film or a stacked film of PI, permanent resist, P—SiN, or P—SiO formed with a film thickness of 1 to 20 μm.

By the processes recited above, a semiconductor device 65 including the film-thickened electrode interconnect 35 is manufactured.

It is unnecessary to form the seed layer 16 in the manufacturing method 55; and therefore, few patterning processes are used similarly to the manufacturing method 51. The entire surface of the second metal layer 18 is coated (covered) with the third metal layer 19 including a potentially stable metal (having a low ionization tendency) during the etching of the first metal layer 14; and therefore, diffusion and corrosion of the metal used for the second metal layer 18 are suppressed.

Further, there are no risks such as those recited above of the third metal layer 19 also coating (covering) the second barrier layer 15 or of the second barrier layer 15 being eroded to expose the seed layer 16.

The electrode interconnect 35 is formed with self-alignment using the third metal layer 19, which coats (covers) the entire exposed surfaces of the second metal layer 18, as a mask. Accordingly, the cross-sectional area of any surface of the electrode interconnect 35 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

Although the case is described in this example where the electrode film of a MOSFET is thickened, the invention is not limited thereto and may be used in the manufacturing of a semiconductor device that includes a film-thickened electrode.

Sixth Embodiment: Manufacturing Method 56

FIGS. 9A to 10C are cross-sectional views of processes, illustrating a method for manufacturing a semiconductor device according to a sixth embodiment of the invention.

A manufacturing method 56 of a semiconductor device 66 of this example includes the following processes.

FIGS. 9A to 10C are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

Figure 9A:
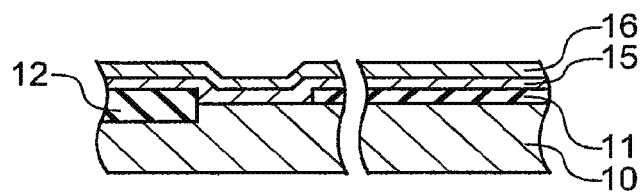
FIGS. 9A to 9D are cross-sectional views of processes, illustrating a method for manufacturing a semiconductor device according to a sixth embodiment of the invention.

As illustrated in FIG. 9A, the second barrier layer 15 and the seed layer 16 are formed in order on the semiconductor substrate 10 including a diffusion layer.

That is, the manufacturing method 51 differs from the manufacturing method 51 in that the first barrier layer 13 and the first metal layer 14 illustrated in FIG. 1A are not formed.

Figure 9B:
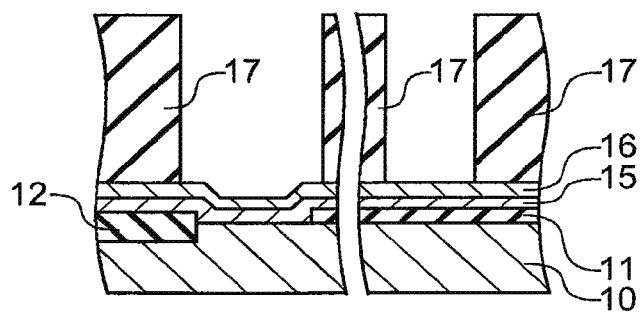

Then, as illustrated in FIG. 9B, the insulating layer 17 such as a resist is formed. The insulating layer 17 is patterned to make an opening.

The opening of the insulating layer 17 formed by patterning forms an electrode pattern.

Figure 9C:
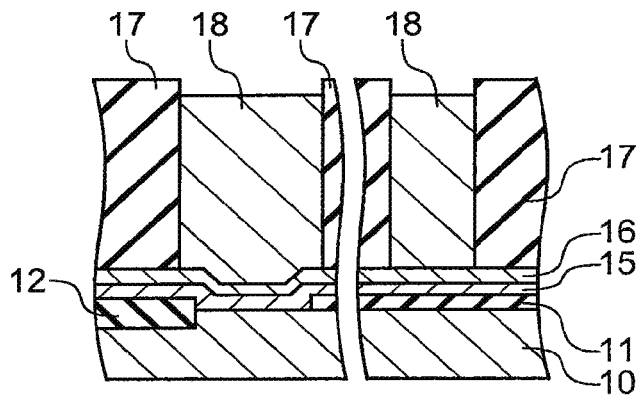

As illustrated in FIG. 9C, the second metal layer 18 is formed by plating.

For example, copper (Cu) is formed with a film thickness of 5 to 10 μm.

The plating may include electroplating using the second barrier layer 15 or the seed layer 16 as the cathode. Or, electroless plating may be used. In such a case, the seed layer 16 is unnecessary.

The seed layer 16 is unnecessary even in the case where the second metal layer 18 is formed by electroplating if the second barrier layer 15 can supply the current and voltage to the surface layer necessary for the electroplating and if the adhesion between the plating layer and the foundation can be ensured.

Figure 9D:
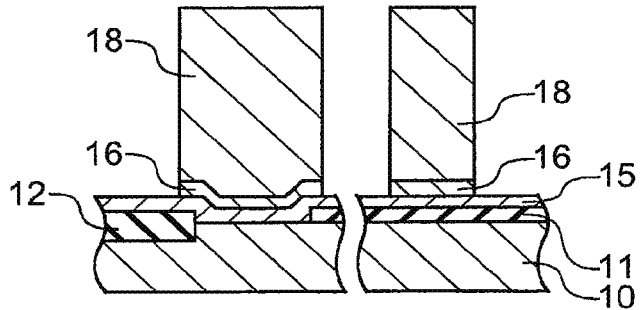

As illustrated in FIG. 9D, the insulating layer 17 is removed.

The insulating layer 17 and the seed layer 16 are removed by etching and the like until the second barrier layer 15 is exposed.

Figure 10A:
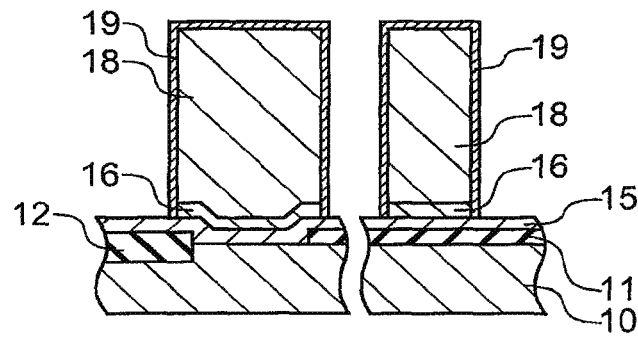
FIGS. 10A to 10C are cross-sectional views of processes, illustrating a method for manufacturing a semiconductor device according to the sixth embodiment of the invention.

Then, as illustrated in FIG. 10A, the entire exposed surfaces of the second metal layer 18 are coated (covered) with the third metal layer 19.

Figure 10B:
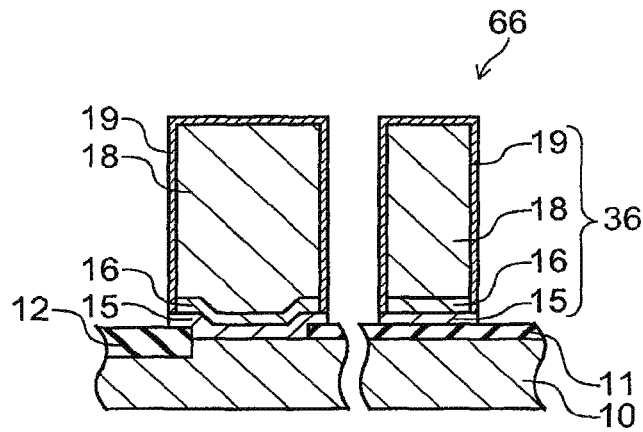

In this state, it is possible to pattern the second barrier layer 15 of the foundation using the third metal layer 19, which coats (covers) the entire exposed surfaces of the second metal layer 18, as a mask (FIG. 10B).

The first barrier layer 13 is removed by etching and the like until the insulating films 11 and 12 are exposed.

The etching may be either wet etching or dry etching.

Thereby, a stacked unit 36 including the second metal layer 18 and the third metal layer 19 is formed in the desired interconnect pattern.

In this example illustrating the method for manufacturing the vertical MOSFET, the stacked unit 36 formed on the semiconductor substrate 10 without the interposed insulating film 11 forms a source pad portion. The stacked unit 36 formed on the insulating film 11 forms a gate pad portion and a gate draw out interconnect portion.

Figure 10C:
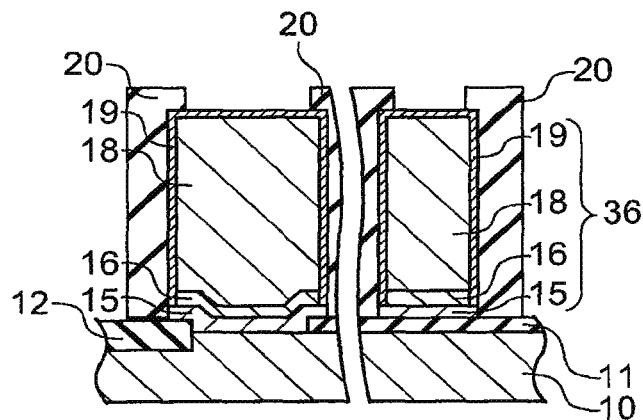

Further, as necessary, the insulating layer 20 (the protective layer) may be filled into the trench made in prior processes (FIG. 10C).

The insulating layer 20 (the protective layer) is, for example, a single film or a stacked film of PI, permanent resist, P—SiN, or P—SiO formed with a film thickness of 1 to 20 µm.

By the processes recited above, a semiconductor device 66 including the film-thickened stacked unit 36 is manufactured.

It is unnecessary to form the first metal layer 14 in the manufacturing method 56; and therefore, few patterning processes are used similarly to the manufacturing method 51. The entire surface of the second metal layer 18 is coated (covered) with the third metal layer 19 including a potentially stable metal (having a low ionization tendency) during the etching of the second barrier layer 15; and therefore, diffusion and corrosion of the metal used for the second metal layer 18 are suppressed.

The stacked unit 36 forming an electrode is formed with self-alignment using the third metal layer 19, which coats (covers) the entire exposed surfaces of the second metal layer 18, as a mask. Accordingly, the cross-sectional area of any surface of the stacked unit 36 parallel to the major surface of the semiconductor substrate 10 is constant; there are no reduced portions; and the cross-sectional area of the second metal layer 18 is greater (than that of the comparative example). In other words, the contact surface area between the second metal layer 18 and the semiconductor substrate 10 or the insulating film 11 can be greater (than that of the comparative example), and a resistance reduction is possible.

However, similarly to the manufacturing method 51, there is a risk in this example that the second barrier layer 15 recited above also may be coated (covered) with the third metal layer 19 and that the second barrier layer 15 may be eroded to expose the seed layer 16. Similarly to the manufacturing method 52 recited above, the risk that the second barrier layer 15 also may be coated (covered) with the third metal layer 19 is eliminated by adding processes of forming the oxide film 21 on the second barrier layer 15 and removing the oxide film 22 of the second metal layer 18.

Although the case is described in this example where the electrode film of a MOSFET is thickened, the invention is not limited thereto and may be used in the manufacturing of a semiconductor device that includes a film-thickened electrode.

However, in the final process of the manufacturing methods 51 to 56 recited above, that is, the process of filling the insulating layer 20 (the protective layer) into the trench patterned in the prior processes to protect the electrode, thermosetting of, for example, the PI (polyimide), etc., is performed (FIG. 2C, FIG. 8D, and FIG. 10C). In such processes, there is a risk of cracks occurring in the third metal layer 19 or alloying or mutual diffusion occurring between the third metal layer 19 and the second metal layer 18.

Another embodiment to solve this problem will now be described.

Seventh Embodiment: Manufacturing Method 57

FIGS. 11A to 11D are cross-sectional views of processes, illustrating a method for manufacturing a semiconductor device according to a seventh embodiment of the invention.

A manufacturing method 57 of a semiconductor device 67 of this example includes the following processes.

FIGS. 11A to 11D are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

The manufacturing method 57 of this example is similar to the manufacturing method 55 recited above up to the forming of the second metal layer 18 illustrated in FIG. 7C by plating; and therefore, a description is omitted.

The subsequent processes will now be described.

Figure 11A:
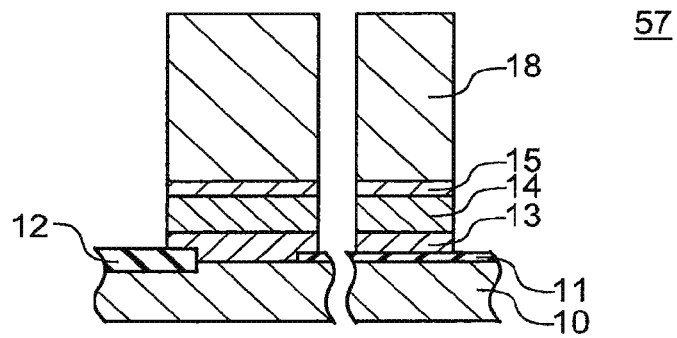
FIGS. 11A to 11D are cross-sectional views of processes, illustrating a method for manufacturing a semiconductor device according to a seventh embodiment of the invention.

As illustrated in FIG. 11A, the insulating layer 17 is removed by etching and the like.

The first metal layer 14 and the first barrier layer 13 and the second barrier layer 15 are removed by etching and the like with self-alignment using the second metal layer 18 as a mask until the insulating films 11 and 12 are exposed. The etching may be either wet etching or dry etching.

Figure 11B:
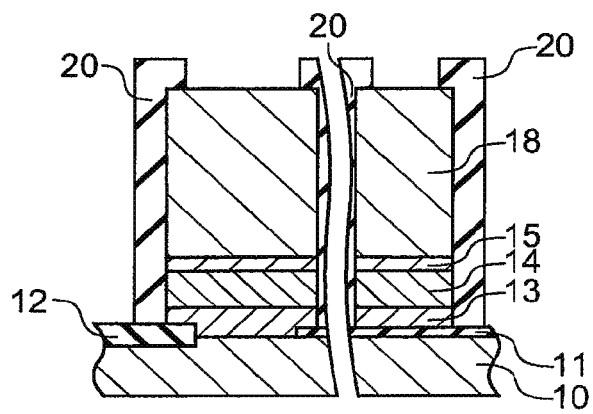

As illustrated in FIG. 11B, the electrode interconnect unit patterned in the prior processes is covered with the insulating layer 20 (the protective layer).

The insulating layer 20 (the protective layer) is, for example, a single film or a stacked film of PI, permanent resist, P—SiN, or P—SiO formed with a film thickness of 1 to 20 µm.

The insulating layer 20 (the protective layer) is patterned to make an opening to expose the upper portion of the second metal layer 18.

Figure 11C:
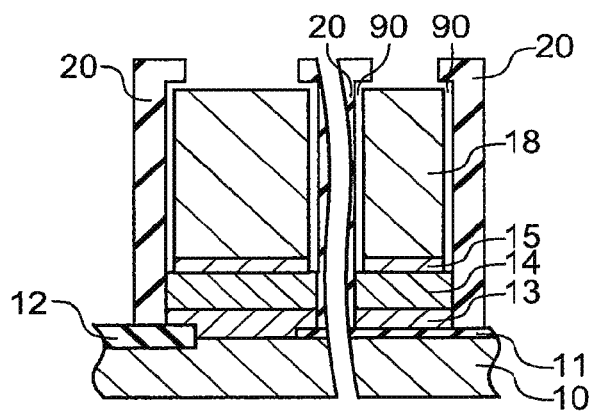

Then, as illustrated in FIG. 11C, the second metal layer 18 is etched to make a space 90 between the insulating layer 20 (the protective layer) and the second metal layer 18 to perform the coating (the covering) with the third metal layer 19. In the case where the third metal layer 19 is formed, for example, with a film thickness of 0.05 µm, the thickness of the space 90 is made accordingly.

The etching may include isotropic etching of the second metal layer 18 using the insulating layer 20 (the protective layer) as a mask.

Figure 11D:
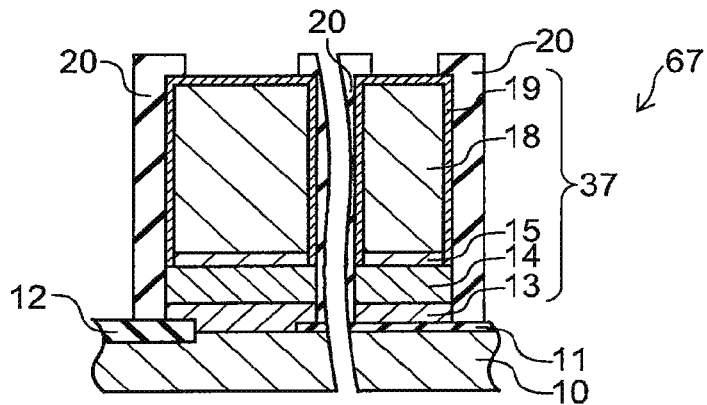

Then, as illustrated in FIG. 11D, the exposed surfaces of the second metal layer 18, i.e., the upper face and the side faces of the second metal layer 18, are coated (covered) with the third metal layer 19. The third metal layer 19 includes a metal having a low ionization tendency, that is, a metal more potentially noble (stable) than the metal (e.g., the copper (Cu)) forming the second metal layer 18. For example, gold (Au), palladium (Pd), platinum (Pt) or the like is formed in the space 90 by electroless plating.

First, nickel (Ni), Ni/Pd, and tin (Sn) may be formed with a film thickness of 1 to 2 µm on the second metal layer 18; and thereupon, a metal more potentially noble (stable) (having a lower ionization tendency) than the second metal layer 18 such as gold (Au), palladium (Pd), and platinum (Pt) may be formed with a film thickness of 0.05 µm.

In the case where, for example, PI is thermoset in the manufacturing method 57 of the semiconductor device of this example, the second metal layer 18 is not yet coated (covered) with the third metal layer 19; and therefore, there is no risk of cracks occurring in the third metal layer 19 or alloying or mutual diffusion between the third metal layer 19 and the second metal layer 18.

Thus, according to the manufacturing method 57 of the semiconductor device of this example, it is unnecessary to establish a new low-temperature PI process, and a conventional PI process can be applied.

An electrode interconnect 37 including the first metal layer 14, the second metal layer 18, and the third metal layer 19 is formed with self-alignment in the desired interconnect pattern.

In this example illustrating the method for manufacturing the vertical MOSFET, the electrode interconnect 37 formed on the semiconductor substrate 10 without the interposed insulating film 11 forms a source pad portion. The electrode interconnect 37 formed on the insulating film 11 forms a gate pad portion and a gate draw out interconnect portion.

By the processes recited above, a semiconductor device 67 including the film-thickened electrode interconnect 37 is manufactured.

Similarly to the manufacturing method 51, the necessary number of patterning processes in the manufacturing method 57 is two, that is, one for patterning each of the insulating layers 17 and 20 to make the openings. The entire surface of the second metal layer 18 is coated (covered) with the third metal layer 19 including a potentially stable metal (having a low ionization tendency) during the final process; and therefore, diffusion and corrosion of the metal used for the second metal layer 18 are suppressed.

Further, there is no risk of reliability fluctuation due to the second barrier layer 15 being eroded to expose the seed layer 16.

The electrode interconnect 37 is formed with self-alignment using the second metal layer 18 as a mask. Accordingly, the cross-sectional area of any surface of the electrode interconnect 37 parallel to the major surface of the semiconductor substrate 10 is constant; and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

In this example, the same case as the manufacturing method 55 without forming the seed layer 16 is described up to the process of removing the insulating layer 17. However, the invention is not limited thereto and may be applied similarly in the case where the seed layer 16 is formed on the second barrier layer 15 as in the other manufacturing methods 51 to 54. Although the case is described in this example where the electrode film of a MOSFET is thickened, the invention is not limited thereto and may be used in the manufacturing of a semiconductor device that includes a film-thickened electrode.

Another embodiment to solve the risk of cracks occurring in the third metal layer 19 or alloying or mutual diffusion occurring between the third metal layer 19 and the second metal layer 18 in the process of thermosetting the PI and the like recited above will now be described.

Eighth Embodiment: Manufacturing Method 58

FIGS. 12A to 12D are cross-sectional views of processes, illustrating a method for manufacturing a semiconductor device according to an eighth embodiment of the invention.

A manufacturing method 58 of a semiconductor device 68 of this example includes the following processes.

FIGS. 12A to 12D are schematic cross-sectional views of the semiconductor device during electrode formation processes of manufacturing processes of the semiconductor device. The illustrated device is a vertical MOSFET similar to that of the example illustrated in FIGS. 1A to 2C; and therefore, a description is omitted.

The manufacturing method 58 of this example is similar to the manufacturing method 57 recited above up to the etching of the first metal layer 14 and the first barrier layer 13 and the second barrier layer 15 with self-alignment using the second metal layer 18 as a mask until the insulating films 11 and 12 are exposed after removing the insulating layer 17 illustrated in FIG. 11A; and therefore, a description is omitted.

The subsequent processes will now be described.

Figure 12A:
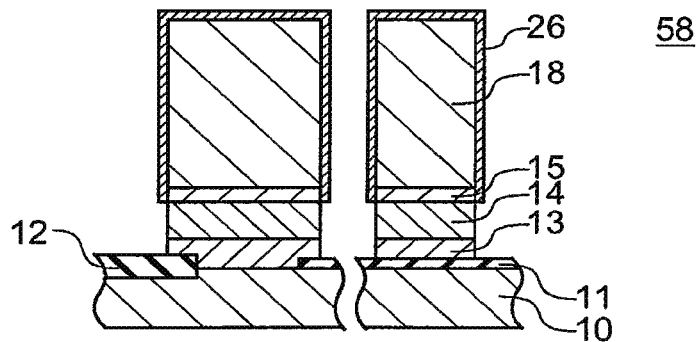
FIGS. 12A to 12D are cross-sectional views of processes, illustrating a method for manufacturing a semiconductor device according to an eighth embodiment of the invention.

As illustrated in FIG. 12A, a covering layer 26 is formed by electroless plating to coat (cover) the upper face and the side faces of the second metal layer 18 after the first metal layer 14 and the first barrier layer 13 and the second barrier layer 15 are formed by patterning.

In the case where the covering layer 26 is a sacrificial layer and PI, for example, is used as the insulating layer 20 (the protective layer), it is sufficient to be formable on the surface of the second metal layer 18 by electroless plating without alloying with the second metal layer 18 caused by thermosetting. For example, nickel (Ni) or Ni/Pd is formed with a film thickness of 0.05 µm. The film thickness of the covering layer 26 becomes the film thickness of the subsequently formed third metal layer 19.

Although a process of forming the covering layer 26 by electroless plating is illustrated in this example, the covering layer 26 may be an oxide film formed on the second metal layer 18.

The oxide film is formed by, for example, heat treatment in an atmosphere of a single gas or a gas mixture of two or more types selected from oxygen ($O_2$), water vapor ($H_2O$), nitrous oxide ($N_2O$), nitric oxide (NO), nitrogen dioxide ($NO_2$), carbon monoxide (CO), and carbon dioxide ($CO_2$); or the single gas or the gas mixture mixed with at least one type of gas selected from argon (Ar), nitrogen ($N_2$), and hydrogen ($H_2$).

In the case where a native oxide film is formed without performing a special heat treatment such as the case where the second metal layer 18 is copper (Cu), the heat treatment is unnecessary, and the manufacturing processes can be simplified.

Further, in the case where the covering layer 26 is formed by electroless plating, it is unnecessary to strictly coat (cover) only the second metal layer 18, and portions of the second barrier layer 15 and the first barrier layer 13 and the first metal layer 14 may be coated (covered).

Figure 12B:
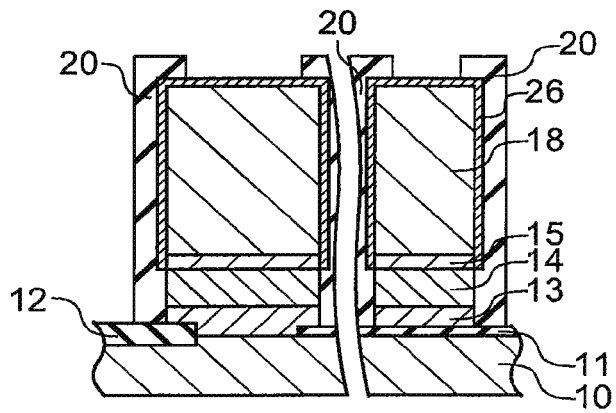

As illustrated in FIG. 12B, the electrode interconnect unit formed by etching in the prior processes is covered with the insulating layer 20 (the protective layer).

The insulating layer 20 (the protective layer) is, for example, a single film or a stacked film of PI, permanent resist, P—SiN, or P—SiO formed with a film thickness of 1 to 20 µm.

The insulating layer 20 (the protective layer) is patterned to make an opening to expose the upper portion of the covering layer 26.

Figure 12C:
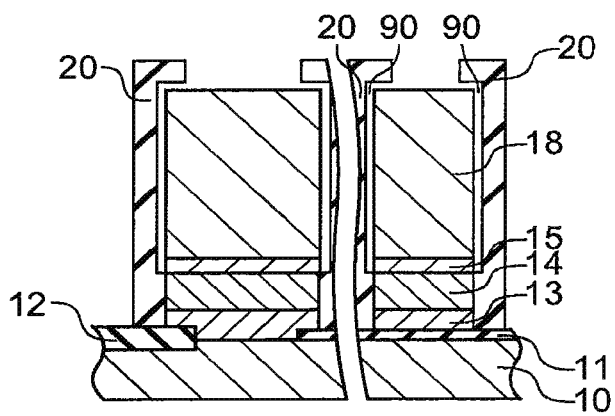

Then, as illustrated in FIG. 12C, the covering layer 26 is etched to make the space 90 between the insulating layer 20 (the protective layer) and the second metal layer 18 to perform the coating (the covering) with the third metal layer 19.

The etching may include isotropic etching of the covering layer 26 using the insulating layer 20 (the protective layer) as a mask. The etching may be performed not only on the covering layer 26 but also on a portion of the second metal layer 18.

Figure 12D:
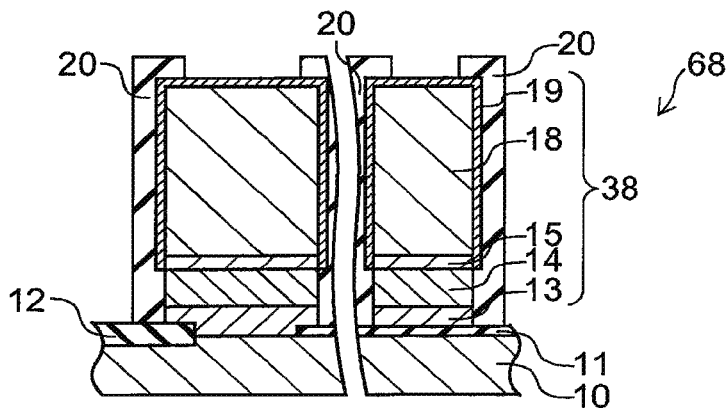

Then, as illustrated in FIG. 12D, the exposed surfaces of the second metal layer 18, i.e., the upper face and the side faces, are coated (covered) with the third metal layer 19. The third metal layer 19 includes a metal having a low ionization tendency, that is, a metal more potentially noble (stable) than the metal (e.g., the copper (Cu)) forming the second metal layer 18. For example, gold (Au), palladium (Pd), platinum (Pt) or the like is formed in the space 90 portion by electroless plating.

First, nickel (Ni), Ni/Pd, and tin (Sn) may be formed on the second metal layer 18 with a film thickness of 1 to 2 µm; and thereupon, a metal more potentially noble (stable) (having a lower ionization tendency) than the second metal layer 18 such as gold (Au), palladium (Pd), and platinum (Pt) may be formed with a film thickness of 0.05 μm.

In the case where, for example, PI is thermoset in the manufacturing method 58 of the semiconductor device of this example, the second metal layer 18 is coated (covered) with the covering layer 26. Although there is a risk of cracks occurring in the covering layer 26, problems do not occur because the covering layer 26 is subsequently removed and coating (covering) with the third metal layer 19 is performed. A metal having no risk of alloying or mutual diffusion with the second metal layer 18 may be selected for the covering layer 26.

Thereby, an electrode interconnect 38 including the first metal layer 14, the second metal layer 18, and the third metal layer 19 is formed with self-alignment in the desired interconnect pattern.

In this example illustrating the method for manufacturing the vertical MOSFET, the electrode interconnect 38 formed on the semiconductor substrate 10 without the interposed insulating film 11 forms a source pad portion. The electrode interconnect 38 formed on the insulating film 11 forms a gate pad portion and a gate draw out interconnect portion.

By the processes recited above, a semiconductor device 68 including the film-thickened electrode interconnect 38 is manufactured.

Similarly to the manufacturing method 51, only the one patterning process of patterning the insulating layer 17 to make the opening is necessary in the manufacturing method 58. The entire surface of the second metal layer 18 is coated (covered) with the third metal layer 19 including a potentially stable metal (having a low ionization tendency) during the final process; and therefore, diffusion and corrosion of the metal used for the second metal layer 18 are suppressed.

Further, there is no risk of reliability fluctuation due to the second barrier layer 15 being eroded to expose the seed layer 16.

The electrode interconnect 38 is formed with self-alignment using the second metal layer 18 as a mask. Accordingly, the cross-sectional area of any surface of the electrode interconnect 38 parallel to the major surface of the semiconductor substrate 10 is constant; and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

In this example, the same case as the manufacturing method 55 without forming the seed layer 16 is described up to the process of removing the insulating layer 17. However, the invention is not limited thereto and may be applied similarly in the case where the seed layer 16 is formed on the second barrier layer 15 as in the other manufacturing methods 51 to 54. Although the case is described in this example where the electrode film of a MOSFET is thickened, the invention is not limited thereto and may be used in the manufacturing of a semiconductor device that includes a film-thickened electrode.

However, if a heating process is performed in the case where copper (Cu) is adjacent to PI, the copper (Cu) may enter into the PI film and cause discoloration and/or deterioration of the film characteristics such as mechanical qualities, etc., of the imide (for example, refer to Institute of Electronics, Information and Communication Engineers Transactions-C, Vol. J71-C, No. 11, pp. 1516 to 1521). Such problems are caused by copper (Cu) dissolving into the polyamic acid contained in the PI.

Accordingly, in the case where, for example, the second metal layer 18 is copper (Cu) and the insulating layer 20 (the protective layer) is PI, there is a risk that thermosetting may cause discoloration and/or deterioration of the film characteristics such as mechanical qualities, etc., of the imide.

Therefore, in the manufacturing methods 51 to 58 of the semiconductor device, the insulating layer 20 (the protective layer) may be formed of PBO (polybenzoxazole) instead of PI.

Ninth Embodiment

FIG. 2B, FIG. 3D, FIG. 5C, FIG. 6D, FIG. 8C, FIG. 10B, FIG. 11D, and FIG. 12D are schematic cross-sectional views of the semiconductor devices 61 to 68 manufactured by the manufacturing methods 51 to 58, respectively, of the invention.

In the semiconductor device 61, the insulating films 11 and 12 are formed on the semiconductor substrate 10 including a diffusion layer as illustrated in FIG. 2B. The insulating films 11 and 12 are single-layer films or stacked films made of $SiO_2$, P—SiN, or P—SiO formed with, for example, a film thickness of 500 to 1,000 nm.

The insulating films 11 and 12 are necessary for the MOSFET of this example and therefore may be formed depending on the case.

The first barrier layer 13 is formed on the semiconductor substrate 10 on which the semiconductor element is formed between the insulating films 11 and 12 and on the insulating films 11 and 12. The first barrier layer 13 is, for example, titanium (Ti), titanium-tungsten (TiW), or titanium nitride (TiN) formed with a film thickness of 300 to 500 nm.

The first metal layer 14 is, for example, aluminum (Al), Al—Si, Al—Si—Cu, or Al—Cu formed on the first barrier layer 13 with a film thickness of 1 to 2 μm.

The second barrier layer 15 is, for example, titanium (Ti), titanium-tungsten (TiW), titanium nitride (TiN), tungsten (W), tantalum (Ta), tantalum nitride (TaN), or ruthenium (Ru) formed on the first metal layer 14 with a film thickness of 100 to 300 nm.

The seed layer 16 and the second metal layer 18 are, for example, copper (Cu) formed on the second barrier layer 15 with a film thickness of 5 to 10 μm. The seed layer 16 is made of the same metal as the second metal layer 18.

The seed layer 16 is necessary during the electroplating of the second metal layer 18 and therefore is unnecessary in the case where the second metal layer 18 can be formed by electroless plating and the like. The seed layer 16 is unnecessary even in the case where the second metal layer 18 is formed by electroplating if the first metal layer 14, the first barrier layer 13 and the second barrier layer 15, and the like can supply the current and voltage to the surface layer necessary for the electroplating and if the adhesion between the layer to be formed by plating and the foundation can be ensured.

The first barrier layer 13, the first metal layer 14, and the second barrier layer 15 are formed to isolate the second metal layer 18 from the semiconductor substrate 10, prevent the second metal layer 18 from diffusing into the semiconductor substrate 10, and prevent reactions between the second metal layer 18 and the semiconductor substrate 10. In the case where the first metal layer 14 can prevent the diffusion of the second metal layer 18 into the semiconductor substrate 10, the first barrier layer 13 and the second barrier layer 15 are unnecessary.

The entire exposed surfaces of the seed layer 16 and the second metal layer 18 are coated (covered) with the third metal layer 19. The third metal layer 19 is a metal more potentially noble (stable) (with a low ionization tendency) than the second metal layer 18 such as, for example, gold (Au), palladium (Pd), platinum (Pt), or the like formed with a film thickness of 0.05 µm. Also, nickel (Ni), Ni/Pd, or tin (Sn) may be formed first on the second metal layer 18 with a film thickness of 1 to 2 µm; and thereupon, a metal more potentially noble (stable) (having a lower ionization tendency) than the second metal layer 18 such as gold (Au), palladium (Pd), or platinum (Pt) may be formed with a film thickness of 0.05 µm.

Voids of the electrode interconnect 31 made of the first metal layer 14, the second metal layer 18, and the third metal layer 19 may be covered with the insulating layer 20 (the protective layer) as necessary. The insulating layer 20 (the protective layer) is, for example, a single film or a stacked film of PBO, PI, permanent resist, P—SiN, or P—SiO formed with a film thickness of 1 to 20 µm.

Diffusion and corrosion can be prevented in the semiconductor device 61 of this example by covering the second metal layer 18 made of, for example, copper (Cu) with the third metal layer 19 including a potentially noble (stable) metal (having a low ionization tendency) such as, for example, gold (Au), palladium (Pd), or platinum (Pt).

The semiconductor device 61 of this example includes the electrode interconnect 31 in which the first metal layer 14, the second metal layer 18, and the third metal layer 19 are formed on the semiconductor substrate 10 by patterning with substantially the same configuration as viewed from a direction perpendicular to the major surface of the semiconductor substrate 10 on which the semiconductor element is formed.

Accordingly, the cross-sectional area of any surface of the electrode interconnect 31 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

As illustrated in FIG. 3D and FIG. 5C, the semiconductor devices 62 and 63 have substantially the same structure as the semiconductor device 61.

In the semiconductor device 64, the entire exposed surfaces of the second barrier layer 15, the seed layer 16, and the second metal layer 18 are coated (covered) with the third metal layer 19 as illustrated in FIG. 6D. In the semiconductor device 65, the exposed surfaces of the second barrier layer 15 and the second metal layer 18 are covered with the third metal layer 19 as illustrated in FIG. 8C.

The semiconductor devices 66 to 68 also have structures similar to that of the semiconductor device 65 in which the exposed surfaces of the second barrier layer 15 and the second metal layer 18, i.e., the upper face and side faces of the second metal layer 18 and the side faces of the second barrier layer 15, are covered with the third metal layer 19.

Because the seed layer 16 is made of the same metal (e.g., copper (Cu)) as the second metal layer 18, the semiconductor device 64 and the semiconductor device 65 have substantially the same structure. Similarly to the semiconductor device 61, such a structure can prevent diffusion and corrosion by the second metal layer 18 being covered with the third metal layer 19 including a potentially noble (stable) metal (having a low ionization tendency). These structures include the electrode interconnects 32 to 35, 37, and 38 in which the first metal layer 14, the second metal layer 18, and the third metal layer 19 are formed on the semiconductor substrate 10 by patterning with substantially the same configuration as viewed from a direction perpendicular to the major surface of the semiconductor substrate 10 on which the semiconductor element is formed.

Accordingly, the cross-sectional area of any surface of the electrode interconnects 32 to 35, 37, and 38 parallel to the major surface of the semiconductor substrate 10 is constant, and there are no reduced portions. The lengths of the first metal layer 14 and the second metal layer 18 are equal in any direction parallel to the major surface of the semiconductor substrate 10, and the upper face surface area of the first metal layer 14 is equal to the lower face surface area of the second metal layer 18. Therefore, the contact surface area between the first metal layer 14 and the second metal layer 18 can be greater (than that of the comparative example), and a resistance reduction is possible.

As illustrated in FIG. 10B, the semiconductor device 66 is similar to the semiconductor device 61 except for the absence of the first barrier layer 13 and the first metal layer 14. However, the second barrier layer 15 is necessary because the first barrier layer 13 and the first metal layer 14 are absent. The second barrier layer 15 isolates the second metal layer 18 from the semiconductor substrate 10, prevents the second metal layer 18 from diffusing into the semiconductor substrate 10, and prevents reactions between the second metal layer 18 and the semiconductor substrate 10.

In the semiconductor device 66, diffusion and corrosion is prevented by the second metal layer 18 being covered with the third metal layer 19 including a potentially noble (stable) metal (having a low ionization tendency). The semiconductor device 66 includes the stacked unit 36 in which the second barrier layer 15, the second metal layer 18, and the third metal layer 19 are formed on the semiconductor substrate 10 by patterning with substantially the same configuration as viewed from a direction perpendicular to the major surface of the semiconductor substrate 10 on which the semiconductor element is formed.

Accordingly, the cross-sectional area of any surface of the stacked unit 36 parallel to the major surface of the semiconductor substrate 10 is constant, and there are no reduced portions. The lengths of the second barrier layer 15 and the second metal layer 18 are equal in any direction parallel to the major surface of the semiconductor substrate 10, and the upper face surface area of the second barrier layer 15 is equal to the lower face surface area of the second metal layer 18. Therefore, the contact surface area between the second barrier layer 15 and the second metal layer 18 can be greater (than that of the comparative example), and a resistance reduction is possible.

Hereinabove, exemplary embodiments of the invention are described with reference to specific examples. However, the invention is not limited to these specific examples. For example, one skilled in the art may appropriately select specific configurations of components of semiconductor devices from known art and similarly practice the invention. Such practice is included in the scope of the invention to the extent that similar effects thereto are obtained.

Further, any two or more components of the specific examples may be combined within the extent of technical feasibility; and are included in the scope of the invention to the extent that the purport of the invention is included.

Moreover, all semiconductor devices practicable by an appropriate design modification by one skilled in the art based on the semiconductor devices described above as exemplary embodiments of the invention also are within the scope of the invention to the extent that the purport of the invention is included.

Furthermore, various modifications and alterations within the spirit of the invention will be readily apparent to those skilled in the art. All such modifications and alterations should therefore be seen as within the scope of the invention.

The invention claimed is:

1. A semiconductor device, comprising:
a semiconductor substrate including a diffusion layer; and
an electrode interconnect,
the electrode interconnect including:
   a first barrier layer formed on the semiconductor substrate;
   a first metal layer formed on the first barrier layer;
   a second metal layer formed on the first metal layer; and
   a third metal layer covering at least a part of a side face of the second metal layer, the third metal layer including a metal having an ionization tendency lower than that of the second metal layer, and a surface of the third metal layer being flush with a side face of the first metal layer,
wherein
the electrode interconnect has a first part and a second part,
the first part includes a portion which is in direct contact with the semiconductor substrate,
the first part is electrically connected to the semiconductor substrate, and
the second part is in contact with an insulating layer which is provided on the semiconductor substrate.

2. The device according to claim 1, wherein the first metal layer includes aluminum, and the second metal layer includes copper.

3. The device according to claim 1, wherein the third metal layer includes at least one selected from a group consisting of gold, platinum and palladium.

4. The device according to claim 1, wherein the insulating layer is a gate insulating film.

* * * * *